US006955980B2

(12) United States Patent
Liu et al.

(10) Patent No.: US 6,955,980 B2
(45) Date of Patent: Oct. 18, 2005

(54) REDUCING THE MIGRATION OF GRAIN BOUNDARIES

(75) Inventors: Kaiping Liu, Plano, TX (US); Zhiqiang Wu, Plano, TX (US); Jihong Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/233,354

(22) Filed: Aug. 30, 2002

(65) Prior Publication Data

US 2004/0043543 A1 Mar. 4, 2004

(51) Int. Cl.[7] .................... H01L 21/3205; H01L 21/44; H01L 21/461; H01L 23/48; H01L 23/52

(52) U.S. Cl. ...................... 438/606; 438/607; 438/687; 438/689; 438/691; 257/758; 257/762; 257/765; 257/767; 257/771

(58) Field of Search ............................... 438/606, 607, 438/687, 689, 691; 257/758, 765, 767, 762, 257/771

(56) References Cited

U.S. PATENT DOCUMENTS

| | | | | | |
|---|---|---|---|---|---|
| 3,725,309 | A | * | 4/1973 | Ames et al. | 428/614 |
| 5,019,891 | A | * | 5/1991 | Onuki et al. | 257/763 |
| 5,148,259 | A | * | 9/1992 | Kato et al. | 257/771 |
| 5,243,221 | A | * | 9/1993 | Ryan et al. | 257/767 |
| 5,311,533 | A | * | 5/1994 | Stutius et al. | 372/46 |
| 5,448,113 | A | * | 9/1995 | Suzuki et al. | 257/767 |
| 5,494,762 | A | * | 2/1996 | Isoyama et al. | 429/221 |
| 5,711,858 | A | * | 1/1998 | Kontra et al. | 204/192.15 |
| 5,853,499 | A | * | 12/1998 | Komatsubara et al. | 148/113 |
| 6,093,503 | A | * | 7/2000 | Isoyama et al. | 429/61 |
| 6,174,807 | B1 | * | 1/2001 | Kizilyalli et al. | 438/655 |
| 6,326,287 | B1 | * | 12/2001 | Asahina et al. | 438/584 |
| 6,459,153 | B1 | * | 10/2002 | Sengupta | 257/758 |

OTHER PUBLICATIONS

M. Backhaus-Ricoult et al., Diffusion Induced Grain BOundary Migration in Cr-doped Alumina during Internal Reduction, Materials Science Forum, vols. 207-209 (1996) pp. 169-172.*

R.A. Vandermeer et al., Microstructural Path and Temperature Dependence of Recrystallization in Commerical Aluminum, Acta- Materialia (UK) , vol. 49, No. 11, (2001) pp. 2083-2094.*

Silicon Processing for the VLSi era, vol. 1 (1995) by Stanley Wolf. pp. 264-265.*

Kittel; "Introduction to Solid State Physics"; Sixth Edition; John Wiley & Sons, Inc.; title page, copyright page, and pp. 559-578, 1986.

* cited by examiner

*Primary Examiner*—Long Pham
*Assistant Examiner*—Shrininvas H Rao
(74) *Attorney, Agent, or Firm*—Peter K. McLarty; W. James Brady, III; Frederick J. Telecky, Jr.

(57) ABSTRACT

A method of forming a semiconductor device includes implanting a precipitate into a gate conductor of an at least partially formed semiconductor device. The gate conductor including a plurality of semiconductor grains. The boundaries of adjacent grains forming a dopant migration path. A plurality of precipitate regions are formed within the gate conductor. At least some of the precipitate regions located at a junction of at least two grains. The gate conductor of the at least partially formed semiconductor device is doped with a dopant. The dopant diffuses inwardly along the dopant migration path.

11 Claims, 1 Drawing Sheet

FIG. 1
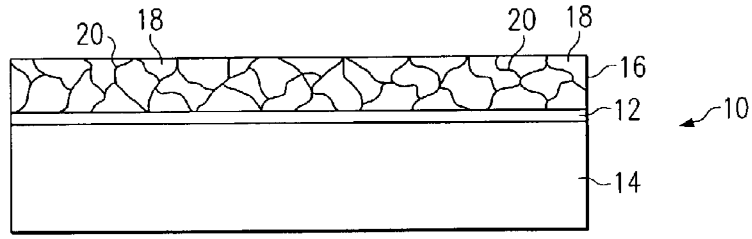
FIG. 2A
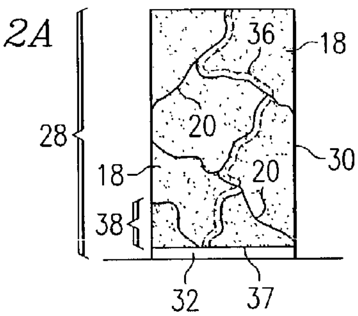
FIG. 2B
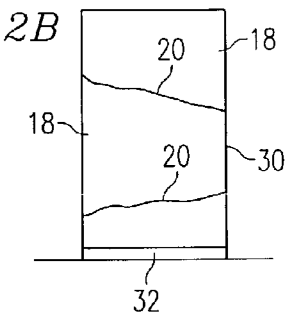
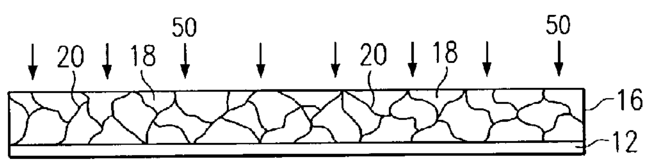
FIG. 3
FIG. 4
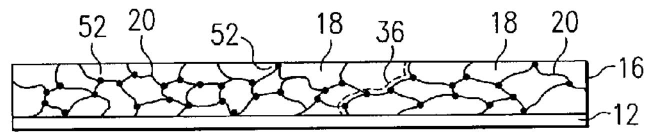
FIG. 5
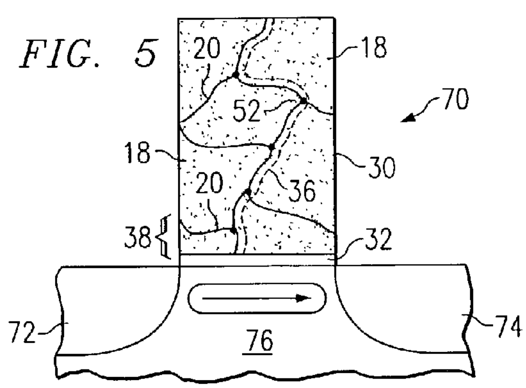

REDUCING THE MIGRATION OF GRAIN BOUNDARIES

TECHNICAL FIELD OF THE INVENTION

This invention relates generally to the field of semiconductor devices and, more particularly, to reducing the migration of grain boundaries within a semiconductor device during high temperature processes.

BACKGROUND OF THE INVENTION

As semiconductor manufacturers continue to reduce the scale of semiconductor devices, the diffusion of dopants throughout the gate layers of semiconductor devices becomes more difficult. Gate layers typically grow in a granular manner such that multiple grains meet at grain boundaries. The grain boundaries may provide a contiguous dopant migration path by which dopant may diffuse through the gate layer. When subjected to high temperature processes, however, grain boundaries may migrate causing the attendant dopant migration paths to also migrate, which is undesirable. Conventional methods for minimizing the migration of grain boundaries in the gate layer often lead to a reduction in dopant diffusion and a reduction in oxide reliability.

SUMMARY OF EXAMPLE EMBODIMENTS

In accordance with the present invention, disadvantages and problems associated with grain boundary migration techniques are reduced or eliminated.

According to one embodiment of the present invention, a method for forming a semiconductor device is disclosed which includes implanting a precipitate into a gate conductor of an at least partially formed semiconductor device. The gate conductor including a plurality of semiconductor grains. The boundaries of adjacent grains forming a dopant migration path. A plurality of precipitate regions are formed within the gate conductor. At least some of the precipitate regions located at a junction of at least two grains. The gate conductor of the at least partially formed semiconductor device is doped with a dopant. The dopant diffuses inwardly along the dopant migration path.

Certain examples of the invention may provide one or more technical advantages. A technical advantage of one exemplary embodiment of the present invention is that the migration of grain boundaries within a gate conductor layer may be minimized. Accordingly, a continuous dopant migration path may be formed to allow for the diffusion of dopant through the gate conductor layer. Another technical advantage is that grain boundaries may be locked in place such that the continuous dopant migration path remains substantially unchanged even when subjected to subsequent high temperature processes. By locking grain boundaries in place before dopant is implanted into the semiconductor device, dopant diffuses more quickly and efficiently through the gate conductor layer, and the resulting semiconductor device will be more reliable and operate in a more efficient manner.

Other technical advantages may be readily apparent to one skilled in the art from the figures, descriptions and claims included herein. None, some, or all of the examples may provide technical advantages.

BRIEF DESCRIPTION OF THE DRAWINGS

For a more complete understanding of the present invention and its features and advantages, reference is now made to the following description, taken in conjunction with the accompanying drawings, in which:

FIG. 1 is a cross-sectional diagram showing the formation of multiple layers on an outer surface of a semiconductor structure;

FIGS. 2A and 2B are cross-sectional diagrams illustrating variable grain sizes within layers of a semiconductor structure and the effect of grain size upon the dopant migration path;

FIG. 3 is a cross-sectional diagram illustrating the implantation of a predoping precipitate according to the teachings of the present invention;

FIG. 4 is a cross-sectional diagram showing the formation of precipitate regions according to the teachings of the present invention; and FIG. 5 is a cross-sectional diagram of a semiconductor structure formed in accordance with the teachings of the present invention to include a continuous dopant migration path.

DETAILED DESCRIPTION OF EXAMPLE EMBODIMENTS

In order to form an integrated circuit device such as a field effect transistor, various conductive and nonconductive layers are typically deposited or grown on a semiconductor substrate or other outer semiconductor layer. FIG. 1 is a cross-sectional view of semiconductor structure 10 after the formation of multiple layers on an outer surface of a semiconductor substrate 14. A gate insulator layer 12 is formed outwardly from semiconductor substrate 14, and a gate conductor layer 16 is formed outwardly from gate insulator layer 12. Semiconductor structure 10 may be used as a basis for forming any of a variety of semiconductor devices, such as a bipolar junction transistor, a NMOS transistor, a PMOS transistor, a CMOS transistor, or other semiconductor based devices.

Semiconductor substrate 14 may comprise any suitable material used in semiconductor chip fabrication, such as silicon, germanium, gallium, arsenide, or other suitable semiconductive material. Gate insulator layer 12 is formed outwardly on the surface of semiconductor substrate 14 using any of a variety of processes. For example, gate insulator layer 12 may be formed by growing an oxide or nitride layer. Using a grown oxide or nitride as gate insulator 12 is advantageous in providing a mechanism for removing surface irregularities in semiconductor substrate 14. As oxide is grown on the surface of substrate 14, a portion of substrate 14 is consumed. The portion consumed generally includes at least some of the surface irregularities present on the surface of semiconductor substrate 14. In various embodiments gate insulator 12 may comprise layers of silicon dioxide, silicon nitride, or combination thereof formed to be on the order of 20 to 100 Angstroms in thickness.

Gate conductor layer 16 is formed outwardly on the surface of gate insulator layer 12 and may comprise amorphous silicon, polysilicon, polysilicon germanium, or other appropriate conductive material used in the fabrication of semiconductor structures. Particles of amorphous silicon or polysilicon typically grow in a granular manner such that two or more grains 18 meet at the grain boundaries 20. Gate conductor layer 12 may be formed by any of a variety of techniques including chemical vapor deposition (CVD). For example, gate conductor layer 16 may be formed by depositing a desired amount of polysilicon over the gate insulator layer 12. In particular embodiments, it may be desirable that gate conductor layer 16 is on the order of 900 to 1600 Angstroms in thickness. The rate at which the polysilicon within gate conductor layer 16 is deposited affects the size of grains 18 in gate conductor layer 16. Accordingly, the rate at which the polysilicon is deposited effects the number and location of grain boundaries 20 within gate conductor layer 16. For example, where gate conductor layer 16 is comprised of polysilicon and the gate conductor-gate insulator stack is to be on the order of 1000 Angstroms in thickness, polysilicon may be deposited at 620° C. for seventeen minutes. Stated differently, the polysilicon comprising gate conductor layer 16 may be deposited at a rate of 9.4 nm per minute. Conversely, a similar stack comprised of amorphous silicon may be deposited at between 560 and 570° C.

FIGS. 2A and 2B are cross-sectional views of semiconductor structures 10 illustrating variable grain sizes within layers of a semiconductor structure and the effect of grain size upon the dopant migration path. A gate stack 28 is formed from gate conductor layer 16 and gate insulator layer 12. Gate stack 28 comprises a gate conductor 30 and a gate insulator 32. The formation of semiconductor gate stack 28 may be effected through any of a variety of processes. For example, semiconductor gate stack 28 may be formed by patterning gate conductor layer 16 and gate insulator layer 12 using suitable photolithographic methods including photo resist mask and etch techniques. In particular embodiments, gate stack 28 has a width on the order of 240 Angstroms and a height on the order of 1000 Angstroms. Particular examples and dimensions, however, as specified throughout this description are intended for exemplary purposes only, and are not intended to limit the scope of the present disclosure. It is recognized that gate stack 28 may be of any appropriate dimensions suitable for the fabrication of semiconductor structures.

At some point, the active regions of semiconductor structure 10 may be formed by doping those areas to adjust the threshold voltage $V_t$ of semiconductor structure 10. These may comprise, for example, source and drain regions or source and drain extension regions. The doping of the active regions of semiconductor structure 10 may occur after the formation of gate insulator 32 and gate conductor 30, and through any of a variety of processes. For example, the doping of the active regions may include low energy ion implantation of a dopant through gate conductor 30, gate insulator 32, and semiconductor substrate 14. In various embodiments, ion implantation comprises the implantation of a relatively high-dose of boron, phosphorous, and/or arsenic dopants. To implant gate stack 28, the dopants implanted on a first surface of the gate conductor 30 and must diffuse through gate conductor 30 before reaching the portions of gate conductor 30 proximate to gate insulator 32. The diffusion of dopant through gate conductor 30 effects the conductivity of an electric field that communicates across gate insulator 32. In such embodiments, the dopant may travel in a substantially vertical direction along a continuous dopant migration path that corresponds to grain boundaries 20. Where no continuous dopant migration path exists through gate conductor 30, the dopant must travel through the grains 18 rather than around them.

FIG. 2A, specifically, is a cross-sectional view of a gate stack 28 that includes gate conductor 30 comprised of smaller grains 18. To achieve a gate conductor 30 of smaller grains 18, gate conductor layer 16 is formed using controlled deposition techniques. The smaller size of grains 18 allows multiple grain boundaries 20 to form a continuous dopant migration path 36. Dopant that is subsequently implanted into gate conductor 30 may diffuse through gate conductor 30 along continuous dopant migration path 36 in a substantially vertical direction until it reaches the portion of gate conductor 30 proximate gate insulator 32. Because dopant may travel along continuous dopant migration path 36, the dopant need not travel through grains 18 to reach an inner gate region 38. Consequently, the presence of continuous dopant migration path 36 increases the rate at which the dopant travels through gate conductor 30 and enables the dopant to more uniformly and efficiently diffuse through gate conductor 30.

By contrast, FIG. 2B is a cross-sectional view of gate stack 28 that includes a gate conductor 30 comprised of larger grains 18. The larger size of grains 18 occurs when the deposition of gate conductor layer 16 is done more quickly or at a higher temperature. The larger size of grains 18 may also result from later occurring high temperature processes. Because the grains 18 are of a larger size, grain boundaries 20 do not form continuous dopant migration path 36. Because gate conductor 30 lacks continuous dopant migration path 36, any dopant implanted into gate conductor 30 must diffuse through grains 18. This is a much slower process than diffusion along a continuous dopant migration path 36 and, therefore, results in a less uniform dopant profile. The dopant profile may be especially less uniform near gate insulator layer 12.

During fabrication, semiconductor structures 10 may undergo multiple thermal cycles. For example, semiconductor substrate 10 may be subjected to high temperature processes if an oxide is grown on the gate stack 28 after the gate etch. Other thermal cycles include high temperature anneals performed after implantation of source and drain regions and source and drain extension regions. When subjected to high temperature processes, grains 18 will recrystallize and typically will grow larger. Recrystallization of grains 18 causes grain boundaries 20 to migrate and become less plentiful. Where continuous dopant migration path 36 exists, such as that illustrated in FIG. 2A, recrystallization of grains 18 may cause the disturbance or elimination of continuous dopant migration path 36. Accordingly, it is desirable to control the deposition of gate conductor layer 16 to achieve a desired grain size and then pin grains 18 in place prior to implanting the dopant into gate conductor 30. Grains 18 may be locked in place before or after gate conductor 30 and gate insulator 32 are patterned from gate conductor layer 16 and gate insulator layer 12, respectively.

FIG. 3 is a cross-sectional view of a semiconductor structure 10 illustrating the implantation of a pre-doping precipitate 50 according to the teachings of the present invention. As discussed with regard to FIG. 1, the rate at which gate conductor layer 16 is deposited may be controlled to produce grains 18 of a particular size. Precipitate 50 acts to pin grains 18 in place to prevent the migration of grain boundaries 20 during recrystallization after high temperature processes.

Precipitate 50 may comprise any appropriate substance of low solid solubility and high diffusivity. In particular embodiments, precipitate 50 comprises an oxygen precipitate. The concentration of oxygen may be varied to control the density of precipitate 50 at grain boundaries 20. Precipitate 50 may be implanted into gate conductor layer 16 using ion implantation or other appropriate implantation technique. By way of example and not by way of limitation, ion implantation of oxygen precipitate 50 in a 1000 angstrom gate stack 28 may be effected at a dose on the order of approximately 1E11 ions/$cm^2$ to 1E13 ions/$cm^2$ and at an implantation energy of approximately 17 to 22 KeV. The dose and implantation energy utilized to implant precipitate 50 into gate conductor layer 16 depends at least in part on the depth of gate conductor layer 16. Upon implantation, precipitate 50 diffuses through gate conductor layer 16 along grain boundaries 20. The presence of precipitate 50 between grain boundaries 20 prevents the migration of grain boundaries 20 after high temperature processes cause grains 18 to recrystallize. This is due to the fact that enough energy must accumulate to rediffuse precipitate 50 before the boundary 20 can migrate.

FIG. 4 is a cross-sectional diagram showing the formation of precipitate regions 52 according to the teachings of the present invention. Precipitate regions 52 are formed after the implantation of precipitate 50. As stated previously, precipitate 50 may comprise any appropriate substance of low solid solubility and high diffusivity. High diffusivity allows for the rapid diffusion of precipitate 50 along the grain boundaries 20 of gate conductor layer 12. As ions of precipitate 50 rapidly diffuse through gate conductor layer 16 or gate conductor 30, multiple ions of precipitate 50 will meet where grain boundaries 20 for multiple grains 18 meet or join. Upon meeting, the ions of precipitate 50 cluster at the grain boundaries 20 and form precipitate regions 52. Due to low solubility, precipitate 50 will precipitate out of the solution even at low concentrations. Additionally, the low solid solubility of precipitate 50 enables precipitate regions 52 bodies to substantially remain intact even after doping and other high temperature processes. In various embodiments where precipitate 50 comprises an oxygen precipitate, precipitate regions 52 comprise clusters of oxygen precipitate 52.

Precipitate regions 52 prevent the migration of grain boundaries 20 within gate conductor layer 16 by pinning grain boundaries 20 in place. Pinned grain boundaries 20 inhibit the migration of continuous dopant migration path 36 during high temperature processes. Because precipitate regions 52 are formed at locations where grain boundaries 20 for multiple grains 18 meet, each precipitate region 52 acts to pin grains 18 at this junction. Accordingly, if precipitate region 52 is formed where the grain boundaries 20 of three grains 18 intersect, precipitate region 52 will pin the three grains 18 in place. During subsequent doping or other high temperature processes, grain boundaries 20 are pinned into place such that their migration is substantially inhibited or prevented. Additionally, because precipitate regions 52 are formed along grain boundaries 20, the presence of precipitate regions 52 does not effect the ability of dopant to diffuse through the gate conductor layer 16. Dopant diffuses through the gate conductor layer along any continuous dopant migration path 38 by passing between grain boundaries 20 and precipitate regions 52.

FIG. 5 is a cross-sectional diagram of a transistor 70 formed in accordance with the teachings of the present invention to include a continuous dopant migration path 36. Transistor 70 also includes gate conductor 30, gate insulator 32, precipitate regions 52, a source region 72, a drain region 74, and a channel region 76 positioned as shown. Transistor 70 is shown after gate conductor 30 and gate insulator 32 have been patterned from gate conductor layer 16 and gate insulator layer 12, respectively. As discussed with regard to FIG. 2, gate conductor 30 and gate insulator 32 may be patterned by ansitropically etching layers 16 and 12, respectively, by performing a plasma etch technique, or by performing any other appropriate technique for forming transistor 70. Transistor 70 may comprise any of a variety of semiconductor structures including a bipolar junction transistor, a NMOS transistor, a PMOS transistor, a CMOS transistor, or other semiconductor based transistor.

Source region 72 and drain region 74 are formed within semiconductor substrate 14. In the illustrated embodiment, source region 72 and drain region 74 extend at least partially under gate insulator layer 32 and are separated by channel region 76 also formed in semiconductor substrate 14. In various embodiments, source and drain regions 72 and 74 may comprise a relatively highdoping concentration of boron, phosphorous, and/or arsenic dopants. Source and drain regions 72 and 74 may be formed after gate conductor 30 and gate insulator 32 are patterned from layers 16 and 12, respectively. Source and drain regions 72 and 74 may be formed, for example, by high-energy ion implantation. In particular embodiments, ion implantation of source and drain regions 72 and 74 comprises implanting each of the boron, phosphorous, and/or arsenic dopants at a dose of approximately $1\times10^{14}$ ions/$cm^2$ to $4\times10^{15}$ ions/$cm^2$ and an implantation energy of approximately 5 to 50 KeV. The implantation energy of the dopants depends at least in part on the desired junction depth of source and drain regions 72 and 74.

As discussed with regard to FIG. 3, high temperature processes may cause the recrystallization of grains 18 and may disrupt or eliminate continuous dopant migration path 36. In the illustrated embodiment, a pre-dopant precipitate 50 has been implanted into gate 30 using ion implantation or other appropriate implantation technique. Precipitate 50 may comprise an oxygen precipitate. In particular embodiments, the pre-dopant precipitate 50 is implanted after patterning gate conductor 30 and gate insulator 32 from gate conductor layers 16 and gate insulator layers 12, respectively. Alternatively, pre-dopant precipitate 50 may be implanted before patterning. As previously discussed, the rate at which the gate conductor layer 16 or gate conductor 30 is implanted with precipitate 50 may be controlled to produce grains 18 of a particular size. Smaller grains 18 allow multiple grain boundaries 20 to form a continuous dopant migration path 36.

The high diffusivity and low solid solubility of precipitate 50 aids in the formation of precipitate regions 52. Specifically, high diffusivity allows for the rapid diffusion of precipitate 50 such that high energy ions of precipitate 50 cluster to form precipitate regions 52. Precipitate regions 52 inhibit the migration of grain boundaries 20 within gate conductor 30 by pinning grain boundaries 20 into place. As discussed with regard to FIG. 4, precipitate regions 52 are formed at locations where the boundaries of multiple grains 18 join, and each precipitate region 52 acts to pin the grains 18 that are proximate to the precipitate region 52. For example, in the illustrated embodiment, precipitate regions 52 are formed at the location where the grain boundaries 20 for three grains 18 meet. Thus, each illustrated precipitate region 52 pins three grains 18 in place.

At some point after implantation of pre-dopant precipitate 50 and the formation of precipitate regions 52, gate conductor 30 may be doped. Gate conductor 30 may be doped after the patterning of gate conductor 30 and gate insulator 32 from gate conductor layer 16 and gate insulator layer 12, respectively. In particular embodiments, doping comprises the low energy ion implantation of a relatively high-dose of boron, phosphorous, and/or arsenic dopants through gate conductor 30. Dopant implanted into gate conductor 30 diffuses through gate conductor 30 along continuous dopant migration path 36 in a substantially vertical direction until it reaches gate insulator 32. The presence of continuous dopant migration path 36 enables the dopant to more uniformly and efficiently diffuse through the entire gate conductor 30 such that dopant is also evenly distributed throughout inner gate region 38 proximate the gate insulator-gate boundary 37. Because precipitate regions 52 pin continuous migration path 36 in place even after transistor 70 is subjected to high temperature thermal cycles, the dopant is able to diffuse uniformly through gate conductor 30 even after high temperature processes.

Uniform diffusion of the dopant through gate conductor 30 effects the conductivity of channel region 76. Placement of voltage on gate conductor 30 effects the conductivity of an electric field communicating across gate insulator 32. In particular embodiments, channel region 76 may be doped to adjust the threshold voltage of transistor 70. Channel region 76 may comprise intrinsic semiconductor material or slightly doped semiconductor material and may be formed through any of a variety of processes. This doping may comprise, for example, ion implantation and diffusion. In one particular example, channel region 76 is formed by a chain implant technique. The term "chain implant" refers to a doping technique that involves multiple implants of the same area. For example, a doping technique that implants channel region 76 three times, the first implant to adjust the threshold voltage ($V_t$), the second implant to substantially prevent punch-through, and the third implant to form a channel stop within transistor 70. In that example, the first and second implants are relatively low energy implants, while the third implant is a higher energy implant.

Although the present invention has been described in detail, it should be understood that various changes, alterations, substitutions, and modifications can be made to the teachings disclosed herein without departing from the spirit and scope of the present invention which is solely defined by the appended claims.

What is claimed is:

1. A method of forming a semiconductor device, comprising:

implanting a precipitate into a gate conductor of an at least partially formed semiconductor device, the gate conductor comprising a plurality of semiconductor grains, the boundaries of adjacent grains forming a dopant migration path;

forming a plurality of precipitate regions within the gate conductor, at least some of the precipitate regions located at a junction of at least two grains; and doping the gate conductor of the at least partially formed semiconductor device with a dopant, the dopant diffusing inwardly along the dopant migration path.

2. The method of claim 1, wherein:

the precipitate comprises an oxygen precipitate; and the precipitate regions comprise a plurality of oxygen ions clustered together.

3. The method of claim 1, wherein implanting the precipitate into the gate conductor comprises implanting an oxygen precipitate at a dose of 1E11 $cm^2$ to 1E13 $cm^2$ and at an implantation energy of 17 KeV to 22 KeV.

4. The method of claim 1, wherein the dopant migration path comprises a continuous dopant migration path initiating proximate a first surface of the gate conductor and terminating proximate a second surface of the gate conductor, the first and second surfaces substantially parallel to one another.

5. The method of claim 4, wherein doping the gate conductor comprises diffusing dopant through the gate conductor from the first surface to the second surface of the gate conductor along the continuous dopant migration path.

6. The method of claim 1, wherein doping the gate conductor comprises doping the gate conductor with a boron dopant.

7. The method of claim 1, further comprising:

forming a source region within a semiconductor substrate of the at least partially formed semiconductor device, the gate conductor disposed outwardly from the semiconductor substrate, the source region extending at least partially under the gate conductor layer; and forming a drain region within the semiconductor substrate, the drain region extending at least partially under the gate conductor layer, the source region and drain region separated by a channel region.

8. The method of claim 1, wherein forming source region and drain region comprises implanting a boron dopant at a dose on the order of about $1\times10^{14}$ ions/$cm^2$ to about $4\times10^{15}$ ions/$cm^2$ and an implantation energy on the order of about 5 to about 50 keV.

9. The method of claim 1, further comprising:

depositing a gate conductor layer on the at least partially formed semiconductor device before implanting the precipitate, the rate at which the gate conductor layer is deposited is controlled to produce smaller grains and the dopant migration path; and etching the gate conductor layer to form the gate conductor before implanting the precipitate.

10. The method of claim 1, further comprising annealing the gate conductor at a high temperature, the precipitate inhibiting the migration of the grain boundaries associated with the grains in the gate conductor during the anneal.

11. A method of forming a semiconductor device, comprising:

forming a gate conductor layer on an at least partially formed semiconductor device, the gate conductor layer comprising a plurality of semiconductor grains, the boundaries of adjacent grains forming a dopant migration path;

etching the at least partially formed semiconductor device to form a gate conductor after the gate conductor layer is formed, the gate conductor comprising a portion of the gate conductor layer;

implanting a precipitate into the gate conductor after etching the at least partially formed semiconductor device, the precipitate diffusing through the gate conductor to form a plurality of precipitate regions within the gate conductor, at least some of the precipitate regions located at a junction of at least two grains;

doping the gate conductor of the at least partially formed semiconductor device with a dopant after the precipitate is implanted into the gate conductor, the dopant diffusing inwardly along the migration path; and implanting a source region and drain region within a semiconductor substrate after the gate conductor is doped, the source and drain regions extending at least partially under the gate conductor layer;

wherein the precipitate regions inhibit the migration of grain boundaries associated with the grains in the gate conductor layer.

* * * * *